United States Patent
Okada

(10) Patent No.: US 9,316,749 B2
(45) Date of Patent: Apr. 19, 2016

(54) RADIATION DETECTOR, RADIOGRAPHIC IMAGING DEVICE, RADIOGRAPHIC IMAGING SYSTEM AND LINE CAPACITANCE ADJUSTING METHOD

(75) Inventor: Yoshihiro Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 941 days.

(21) Appl. No.: 13/485,114

(22) Filed: May 31, 2012

(65) Prior Publication Data

US 2013/0001427 A1 Jan. 3, 2013

(30) Foreign Application Priority Data

Jun. 29, 2011 (JP) .................. 2011-144931

(51) Int. Cl.
| | |
|---|---|
| H01L 27/142 | (2014.01) |
| G01T 1/24 | (2006.01) |
| H01L 25/00 | (2006.01) |
| H01L 27/00 | (2006.01) |
| G01T 1/20 | (2006.01) |

(52) U.S. Cl.
CPC .............. *G01T 1/2018* (2013.01); *G01T 1/24* (2013.01); *H01L 25/00* (2013.01); *H01L 27/00* (2013.01); *H01L 27/142* (2013.01)

(58) Field of Classification Search
CPC ........... G01T 1/24; H01L 25/00; H01L 27/00; H01L 27/142
USPC .................... 250/370.08, 370.09, 370.14, 371
See application file for complete search history.

(56) References Cited

FOREIGN PATENT DOCUMENTS

| | | |
|---|---|---|
| JP | 2003-57350 A | 2/2003 |
| JP | 2004-170216 A | 6/2004 |
| JP | 2005-147958 A | 6/2005 |
| JP | 2008-132216 A | 6/2008 |

OTHER PUBLICATIONS

Japanese Office Action dated Aug. 26, 2014, issued in corresponding Japanese Patent Application No. 2011-144931.

*Primary Examiner* — David Porta
*Assistant Examiner* — Carolyn Igyarto
(74) *Attorney, Agent, or Firm* — Birch, Stewart, Kolasch & Birch, LLP

(57) ABSTRACT

The present invention provides a radiation detector, a radiographic imaging device, a radiographic imaging system and a line capacitance adjusting method that may suppress image irregularities from occurring in the obtained radiographic images. Namely, the line capacitance difference between each of plural signal lines is reduced by adjusting elements (capacitors) connected to at least one of the plural signal lines.

14 Claims, 17 Drawing Sheets

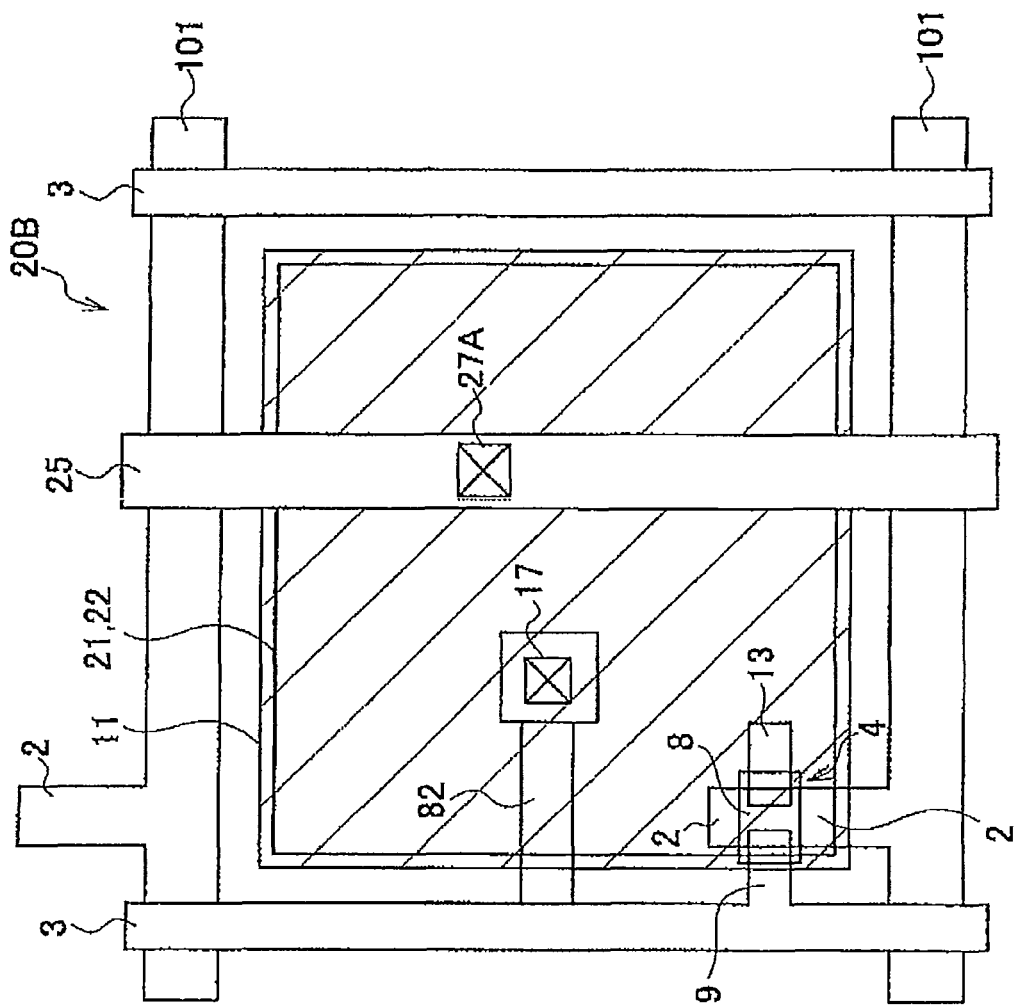

RADIATION DETECTOR, RADIOGRAPHIC IMAGING DEVICE, RADIOGRAPHIC IMAGING SYSTEM AND LINE CAPACITANCE ADJUSTING METHOD

CROSS-REFERENCE TO RELATED APPLICATION

This application claims priority under 35 USC 119 from Japanese Patent Application No. 2011-144931, filed on Jun. 29, 2011 the disclosure of which is incorporated by reference herein.

BACKGROUND OF THE INVENTION

1. Field of the Invention

The present invention relates to a radiation detector, a radiographic imaging device, a radiographic imaging system and a line capacitance adjusting method. The present invention particularly relates to a radiation detector, a radiographic imaging device and a radiographic imaging system for detecting radiographic images, and a line capacitance adjusting method for adjusting the line capacitance of a signal line provided to the radiation detector.

2. Description of the Related Art

Radiation detectors such as Flat Panel Detection elements (FPD), having a radiation sensitive layer disposed above a Thin Film Transistor (TFT) active matrix substrate, and capable of converting radiation such as X-rays directly into digital data, are recently being put into practice. Radiographic imaging devices employing such radiation detectors allow images to be checked in real time, and enable successive radiographic images to be imaged and fluoroscopy (video imaging) to be performed, in contrast to conventional radiographic imaging devices employing X-ray film or imaging plates.

However, in such types of radiographic imaging device, if the radiographic imaging device itself can detect, for example, the start or end of radiation irradiation and irradiance level, connection to a control device for performing control of for example the radiographic imaging device and the radiation source, and connection to a radiation source becomes unnecessary. Accordingly, a simplification of system configuration and simplification of control by an imaging control device is desired.

Japanese Patent Application Laid-Open (JP-A) No. 2005-147958 discloses a radiographic imaging device capable of detecting a radiation irradiation state. This radiographic imaging device includes plural first photoelectric conversion elements, plural switch elements, drive lines, second photoelectric conversion elements and bias lines. Switch elements are connected to the first photoelectric conversion elements. The drive lines transmit signals to switch plural switch elements ON/OFF. The second photoelectric conversion elements are formed above the drive lines. The bias lines are connected to the first photoelectric conversion elements and the second photoelectric conversion elements. The first photoelectric conversion elements and the second photoelectric conversion elements are formed on the same substrate.

Further, JP-A No. 2004-170216 discloses a radiation detection apparatus provided with second pixels for detecting radiation irradiation. This radiation detection apparatus includes a radiation conversion section disposed with plural conversion elements for converting incident radiation into electric signals on a substrate. In the radiation conversion section, the conversion elements are each connected to a signal line via a switch element for electric signal transfer. First pixels for outputting signals for generating an image and the conversion elements are connected directly to the signal lines.

However, in the technology described in JP-A No. 2005-147958 and JP-A No. 170216, the pixels for detecting a state of radiation irradiation and the pixels for detecting a radiographic image respectively output accumulated electric signals. Accordingly, differences in line capacitance consequently occur between each of the signal lines, and line shaped image irregularities occur in radiographic images according to the differences in line capacitance.

SUMMARY OF THE INVENTION

The present invention provides a radiation detector, a radiographic imaging device, a radiographic imaging system and a line capacitance adjusting method, capable of suppressing image irregularities from occurring in the obtained radiographic images.

A first aspect of the present invention is a radiation detector including plural radiation detection pixels that detect a state of irradiation of radiation; plural image detection pixels that detect a radiographic image expressing the radiation that has passed through an imaging subject; plural signal lines, connected to at least one of the radiation detection pixels and/or to the image detection pixels, through which electric signals expressing a detection state of connected pixels flow; and plural adjusting elements, connected to at least one of the plural signal lines, that adjusts to reduce the line capacitance difference between each of the plural signal lines.

According to a radiation detector of the first aspect of the present invention, electric signals expressing a detection state of connected pixels flow through the plural signal lines due to the signal lines being connected to at least one of the radiation detection pixels and/or the image detection pixels. The radiation detection pixels detect a state of irradiation of radiation. The image detection pixels detect a radiographic image expressing radiation that has passed through an imaging subject.

In the first aspect of the present invention, the line capacitance difference between each of the plural signal lines is adjusted so as to be reduced, by the adjusting element connected to at least one of the plural signal lines.

According to a radiation detector of a first aspect of the present invention, the line capacitance difference between each of the plural signal lines is thereby adjusted so as to be reduced by the adjusting element connected to at least one of the plural signal lines. Accordingly, the first aspect of the present invention may suppress image irregularities from occurring in the imaged radiographic images.

In a second aspect of the present invention, in the above aspect, the adjusting elements may be connected to the signal lines that have a difference equal to or greater than a predetermined value, wherein the difference is a difference when maximum line capacitance out of the plurality of signal lines is compared to its line capacitance. According to the above aspect, the present invention may obtain the desired image irregularities suppressing effect according to the value set for the predetermined value.

In a third aspect of the present invention, in the second aspect, the adjusting elements may have a capacitance less than the difference. According to the above aspect, the present invention may reliably suppress the image irregularities from occurring.

In a fourth aspect of the present invention, in the first aspect, the adjusting elements may be connected to each of the plurality of signal lines. According to the above aspect, the present invention may reduce the difference in line capacitance with greater precision.

In a fifth aspect of the present invention, in the above aspect, the adjusting elements may be capacitive elements. According to the above aspect, the present invention may form the capacitive elements fabrication processes similar to those of the image detection pixels and the radiation detection pixels, and therefore, may be fabricated more easily.

In a sixth aspect of the present invention, in the above aspect, the image detection pixels may each include a sensor portion that accumulates charges that are generated due to irradiation of the radiation, and a switching element that reads out the charges that have been accumulated in the sensor portion, and the radiation detection pixels may each include the sensor portion, and the switching element having switch terminals short-circuited. According to the above aspect, the present invention may configure the image detection pixels and the radiation detection pixels in substantially same configuration, and may be fabricated easier than in a case in which the image detection pixels and the radiation detection pixels have different configurations.

In a seventh aspect of the present invention, in the sixth aspect, the adjusting elements may be configured similarly to the radiation detection pixels. According to the above aspect, the present invention may be fabricated easier than in a case in which the adjusting element is configured with a different configuration to the radiation detection pixels.

In an eighth aspect of the present invention, in the above aspect the adjusting elements may be connected to the respective signal line in at least one position selected out of, one end portion side of the signal line outside a region where the at least one of the radiation detection pixels and/or the image detection pixels are connected, other end portion side of the signal line outside the region; and inside a connection region of the signal line in which plural radiation detection pixels and/or plural image detection pixels are connected. According to the above aspect, the present invention may alleviate structural limitations that may arise from the provision of the adjusting element.

A ninth aspect of the present invention is a radiographic imaging device including, the radiation detector of any one of the first aspect to the eighth aspect, and a determination section that determines a radiation irradiation state based on the electric signals obtained from the signal lines connected to the radiation detection pixels in the radiation detector.

The radiographic imaging device of the ninth aspect of the present invention includes the radiation detector of the present invention. In the ninth aspect of the present invention, the radiation irradiation state is determined by the determination section based on the electric signals obtained from the signal lines connected to the radiation detection pixels in the radiation detector.

Due to being provided with the radiation detector of the above aspects, the radiographic imaging device of the ninth aspect of the present invention may suppress image irregularities from occurring in the imaged radiographic images, similarly to with the radiation detector of the present invention.

In a tenth aspect of the present invention, in the ninth aspect, the radiation irradiation state may be at least one state, out of start of irradiation of the radiation, irradiance level of the radiation, or end of the irradiation of the radiation. According to the above aspect, the present invention may detect the applied radiation irradiation state.

An eleventh aspect of the present invention is a radiographic imaging device including: a radiation detector including, plural radiation detection pixels that detect a state of irradiation of radiation, plural image detection pixels that detect a radiographic image expressing the radiation that has passed through an imaging subject, and plural signal lines, connected to at least one of the radiation detection pixels and/or to the image detection pixels, through which electric signals expressing a detection state of connected pixels flow; determination section that determines the a state of irradiation of radiation based on electric signals obtained from the signal lines connected to the radiation detection pixels in the radiation detector; and plural adjusting elements, connected to at least one of the plural signal lines, that adjusts to reduce the line capacitance difference between each of the plural signal lines.

According to a radiographic imaging device of the eleventh aspect of the present invention, electric signals expressing a detection state of connected pixels flow through the plural signal lines connected to at least one of the radiation detection pixels and/or the image detection pixels. The radiation detection pixels detect the state of irradiation of radiation. The image detection pixels detect a radiographic image expressing radiation that has passed through an imaging subject.

In the eleventh aspect of the present invention, the radiation irradiation state is determined by the determination section, based on electric signals obtained from the signal lines connected to the radiation detection pixels.

In the eleventh aspect of the present invention, adjustment is performed such that the line capacitance difference between each of the plural signal lines is adjusted so as to be reduced by the adjusting element, that is connected to at least one of the plural signal lines.

According to a radiographic imaging device of the eleventh aspect of the present invention, the line capacitance difference between each of the plural signal lines is adjusted so as to be reduced by the adjusting element connected to at least one of the plural signal lines. Accordingly, the eleventh aspect of the present invention may suppress image irregularities from occurring in the imaged radiographic images.

In a twelfth aspect of the present invention, in the eleventh aspect, may further include plural amplification circuits that amplify the electric signals flowing in the plurality of signal lines, wherein the adjusting elements are connected to the amplifier circuits.

A thirteenth aspect of the present invention is a radiographic imaging system including: the radiographic imaging device of any one of the ninth aspect to the twelfth aspect; and a radiation irradiation device that irradiates the radiation for imaging the radiographic image in the radiographic imaging device.

The radiographic imaging system of the thirteenth aspect of the present invention includes the radiographic imaging device of the present invention, and the radiation irradiation device irradiates the radiation for imaging the radiographic image in the radiographic imaging device.

According to the thirteenth aspect of the present invention, due to including the radiographic imaging device of the present invention, the radiographic imaging system may suppress image irregularities from occurring in the imaged radiographic images, similarly to with the radiographic imaging device.

A fourteenth aspect of the present invention is a line capacitance adjusting method including: connecting adjusting elements to at least one of plural signal lines, connected to at least one of a plural radiation detection pixels that detect a state of irradiation of radiation, and/or a plural image detection pixels that detect a radiographic image expressing the radiation that has passed through an imaging subject, and through which electric signals expressing a detection state of connected pixels flow, the adjusting elements adjusts to reduce the line capacitance difference between each of the plural signal lines.

Similarly to the radiation detector of the present invention, the fourteenth aspect of the present invention may suppress image irregularities from occurring in imaged radiographic images as in the radiation detector of the present invention.

According to the above aspects of the present invention, the line capacitance difference between each of the plural signal lines may be adjusted so as to be reduced by the adjusting element that is connected to at least one of the plural signal lines. Accordingly, the above aspects of the present invention may suppress image irregularities from occurring in the obtained radiographic images.

BRIEF DESCRIPTION OF THE DRAWINGS

Exemplary embodiments of the present invention will be described in detail based on the following figures, wherein:

FIG. 17 is a plan view illustrating a configuration of a pixel according to an alternative exemplary embodiment.

DETAILED DESCRIPTION OF THE INVENTION

Detailed explanation follows regarding exemplary embodiments of the present invention, with reference to the drawings.

[First Exemplary Embodiment]

Figure 1:
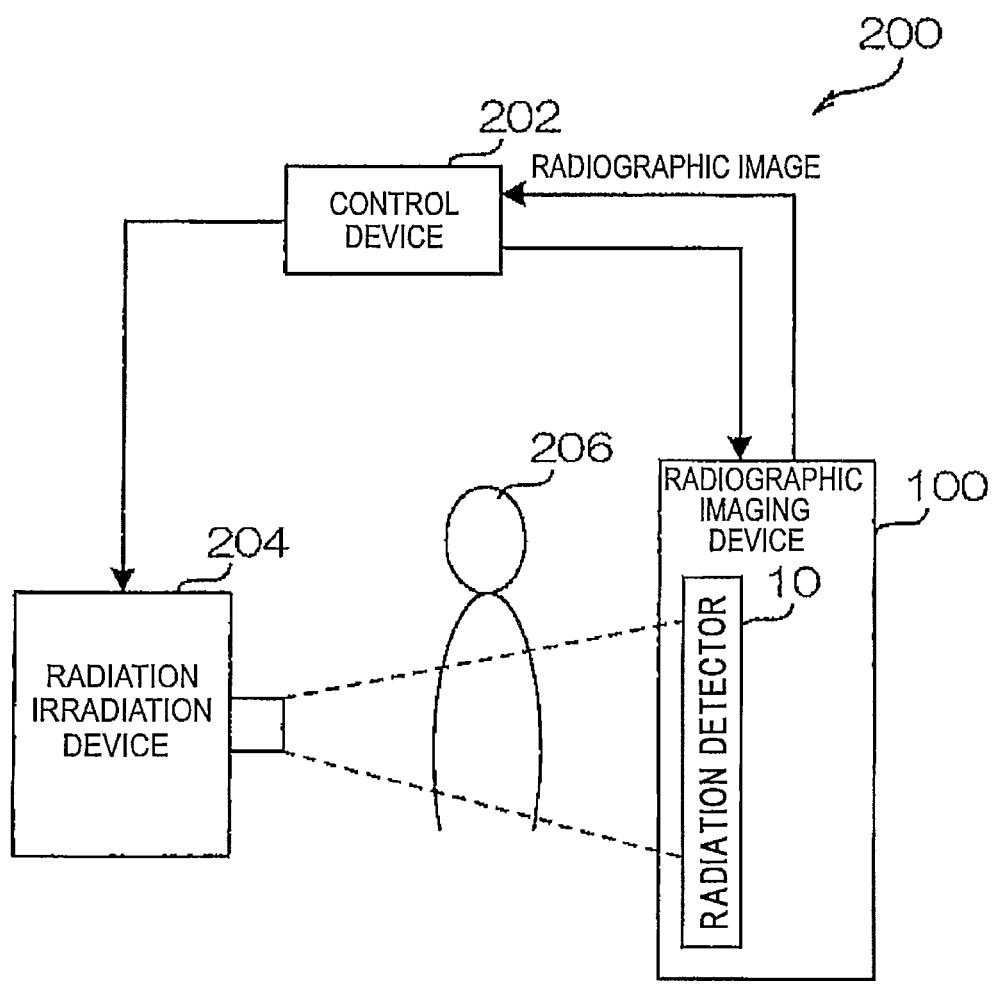
FIG. 1 is a configuration diagram illustrating an overall configuration of a radiographic imaging system according to an exemplary embodiment.

Explanation first follows regarding a radiographic imaging system 200 according to a first exemplary embodiment, with reference to FIG. 1.

The radiographic imaging system 200 according to the present exemplary embodiment includes a radiation irradiation device 204, a radiographic imaging device 100 equipped with a radiation detector 10, and a control device (also called a console) 202. The radiation irradiation device 204 irradiates radiation (for example, X-rays) onto an imaging subject 206. The radiation detector 10 detects radiation that has been irradiated from the radiation irradiation device 204 and passed through the imaging subject 206. The control device 202 performs control on the radiation irradiation device 204 and the radiographic imaging device 100 related to imaging radiographic images. The control device 202 also acquires image data expressing radiographic images obtained by imaging, from the radiographic imaging device 100.

In the radiographic imaging system 200 of the present exemplary embodiment, radiation is irradiated from the radiation irradiation device 204 according to timing, controlled by the control device 202. Then, radiation carrying a radiographic image in a passed-through region, due to passing through the imaging subject 206 pre-positioned in an imaging position, is irradiated onto the radiographic imaging device 100. The radiographic imaging device 100 images the radiographic image carried in the irradiated radiation.

Figure 2:
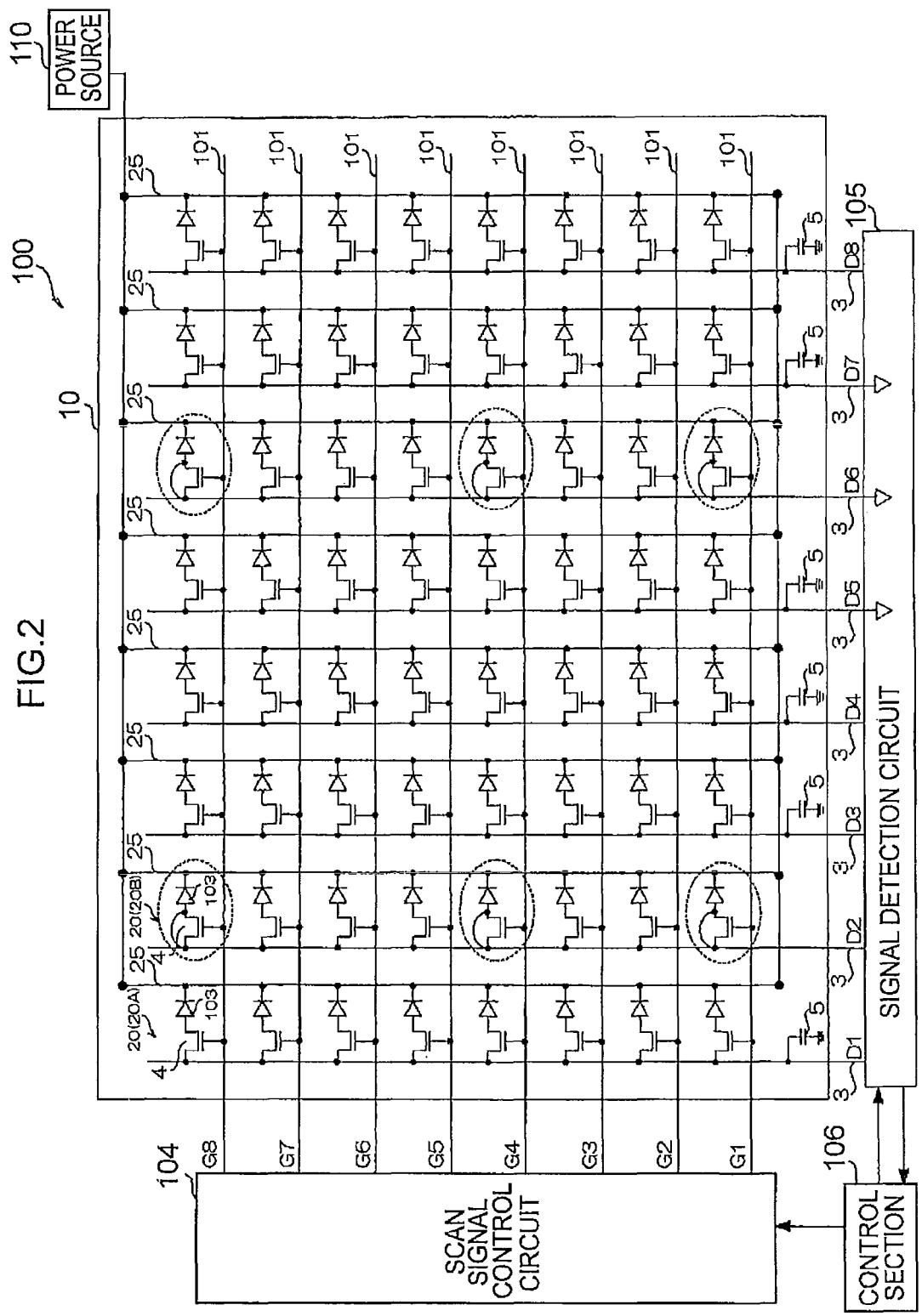
FIG. 2 is a circuit diagram (and partial block diagram) illustrating relevant portions of an electric system of a radiographic imaging device according to a first exemplary embodiment.

Explanation now follows regarding a configuration of an electric system of the radiographic imaging device 100 according to the present exemplary embodiment, with reference to FIG. 2. Explanation is given here of a case in which an indirect-conversion-type radiation detector is applied to the present invention, that first converts radiation, such as X-rays into light, and then coverts the light into charges. Note that scintillator employed for converting radiation into light is omitted in FIG. 2.

As shown in FIG. 2, in the radiation detector 10 according to the present exemplary embodiment, plural pixels 20 each configured including a sensor portion 103 and a Thin Film Transistor (TFT) switch 4 serving as a switching element, are arrayed in a matrix. The sensor portions 103 receive light and generate charges, and accumulate the generated charges. The TFT switches 4 are switching elements for reading out charges accumulated in the sensor portions 103. In the present exemplary embodiment the sensor portions 103 generate charges due to illumination of light that has been converted by the scintillator.

Plural of the pixels 20 of the present exemplary embodiment are disposed in a matrix along a first direction (the direction of scan lines 101 in FIG. 2: the across direction in FIG. 2) and a direction intersecting with the row direction (the direction of the signal lines 3 in FIG. 2: the vertical direction in FIG. 2). The array of the pixels 20 is simplified in the illustration of FIG. 2, however in reality there are for example 1024×1024 individual pixels 20 disposed along the direction of the scan lines and direction of the signal lines.

In the radiation detector 10 according to the present exemplary embodiment, the plural pixels 20 are pre-defined as pixels 20A (image detection pixels) for detecting radiation image, or pixels 20B (radiation detection pixels) for detecting a radiation irradiation state. Note that, in FIG. 2, the pixels 20B are encircled with intermittent lines. The pixels 20A are employed to detect radiation and to generate an image expressing the detected radiation. The pixels 20B are pixels employed to detect the state of radiation irradiation, and are pixels that output charges even during charge accumulation periods.

Figure 4:
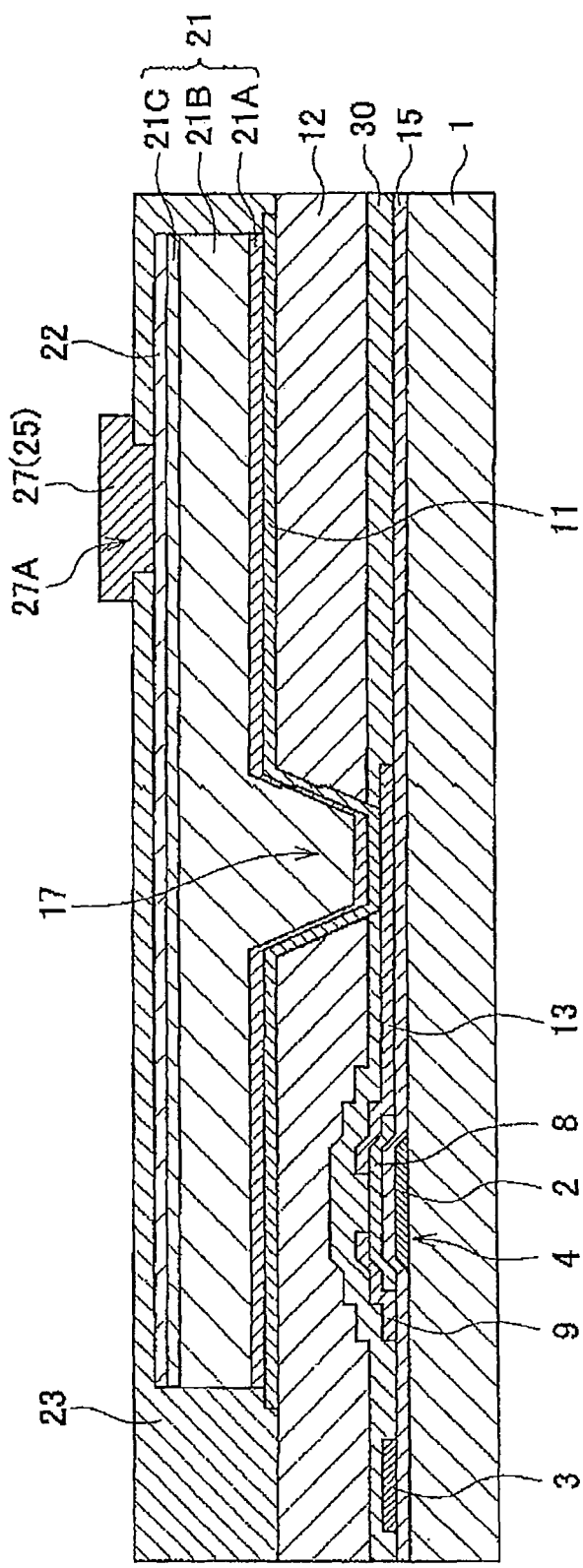
FIG. 4 is a cross-sectional view of a pixel according to an exemplary embodiment.

In the radiation detector 10 according to the present exemplary embodiment, plural scan lines 101 and plural signal lines 3 are disposed to intersect with each other, on a substrate 1 (see FIG. 4, not shown in FIG. 2). The scan lines 101 switch ON/OFF the TFT switches 4. The signal lines 3 read out the charges accumulated in the sensor portions 103. In the present exemplary embodiment, a single signal line 3 is provided for each pixel line in the column direction, and a single scan line 101 is provided for each pixel line in the row direction. Therefore, for example, in a case where there are 1024×1024 pixels 20 are disposed in the scan line direction and the signal line direction, 1024 scan lines and 1024 signal lines are provided.

Further, in the radiation detector 10 according to the present exemplary embodiment, common electrode lines 25 are provided parallel to each of the signal lines 3. The common electrode lines 25 are connected together in parallel at one end portion and other end portion thereof, and a power source 110 that applies a specific bias voltage is connected to the one end portion. Each of the sensor portions 103 is connected to the common electrode lines 25 and is applied with a bias voltage via the common electrode lines 25.

Scan signals flow in each of the scan lines 101 for switching the TFT switches 4 connected to each of the scan lines 101. Each of the TFT switches 4 is switched (ON/OFF) by the scan signals flowing in each of the scan lines 101.

Electric signals, corresponding to charges that have been accumulated in each of the pixels 20, flow in each of the signal lines 3, depending on the switching state of the TFT switches 4 of the connected pixels 20. Namely, electric signals corresponding to the amount of charges accumulated in the given pixel 20 flow in the given signal line 3, when one of the TFT switch 4 of any pixel 20 connected to a given signal line 3 is switched ON.

Each of the signal lines 3 is connected to a signal detection circuit 105 for detecting the electric signals flowing out of each of the signal lines 3. Each of the scan lines 101 is connected to a scan signal control circuit 104 for outputting to each of the scan lines 101 scan signals for switching the TFT switches 4 ON/OFF. In FIG. 2, simplification has been made to a single of the signal detection circuit 105 and a single of the scan signal control circuit 104. However, for example, when plural signal detection circuits 105 and plural scan signal control circuits 104 are provided, each is connected to a specific number (for example 256) of the signal lines 3 or the scan lines 101. For example when there are 1024 lines provided for both the signal lines 3 and the scan lines 101, four scan signal control circuits 104 are provided, connected one for every 256 scan lines 101, and four signal detection circuits 105 are provided, connected one for every 256 signal lines 3.

The signal detection circuit 105 according to the present exemplary embodiment is installed with an amplification circuit for amplifying input electric signals, and with an analogue-to-digital converter (ADC) (see also FIG. 6) for each of the signal lines 3. In the signal detection circuit 105, electric signals input from each of the signal lines 3 are amplified by the amplification circuit and are converted to digital signals (referred to below as "image data") by the ADC.

A control section 106 is connected to the signal detection circuits 105 and the scan signal control circuits 104. The control section 106 performs specific processing, such as noise reduction processing, on the image data converted in the signal detection circuits 105. Further, the control section 106 outputs control signals to the signal detection circuits 105 expressing timing for signal detection, and outputs to the scan signal control circuits 104 control signals expressing timing for output of scan signals.

The control section 106 of the present exemplary embodiment is configured by a microcomputer, and is provided with a central processing unit (CPU), a ROM, a RAM and a non-volatile memory section configured by flash memory or the like. The control section 106 executes a program stored in the ROM with the CPU, and thus performs control for imaging a radiographic image. The control section 106 applies process to interpolate image data for the radiation detection pixels 20B (interpolation processing) to the image data, to which the above-mentioned predetermined processing has been applied, and generates an image representing the irradiated radiation. Namely, the control section 106 generates the image representing the irradiated radiation by interpolating image data for the radiation detection pixels 20B on the basis of the image data to which the above-mentioned predetermined processing has been applied.

Figure 3:
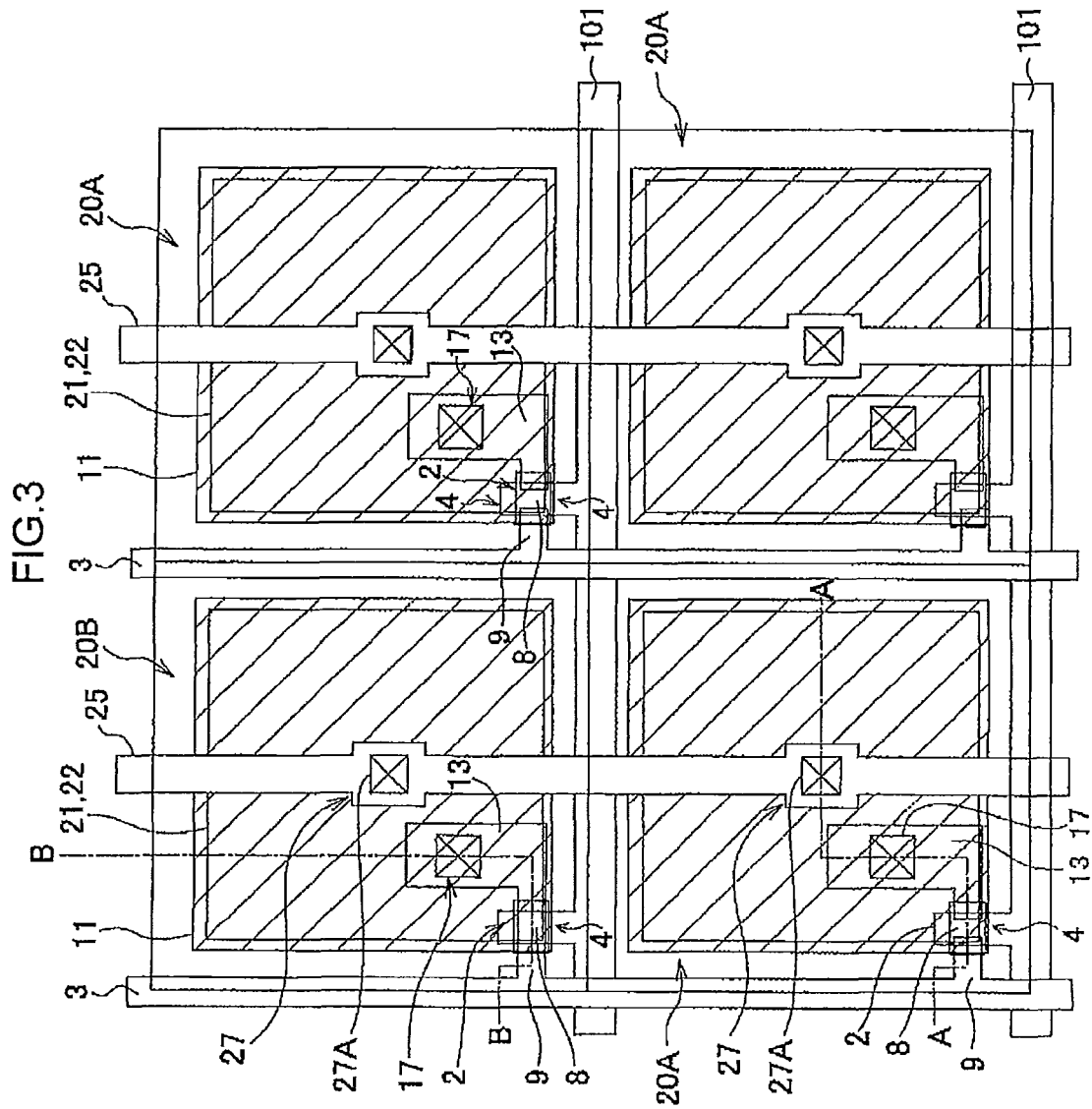
FIG. 3 is a plan view illustrating a configuration of pixels according to an exemplary embodiment.
Figure 5:
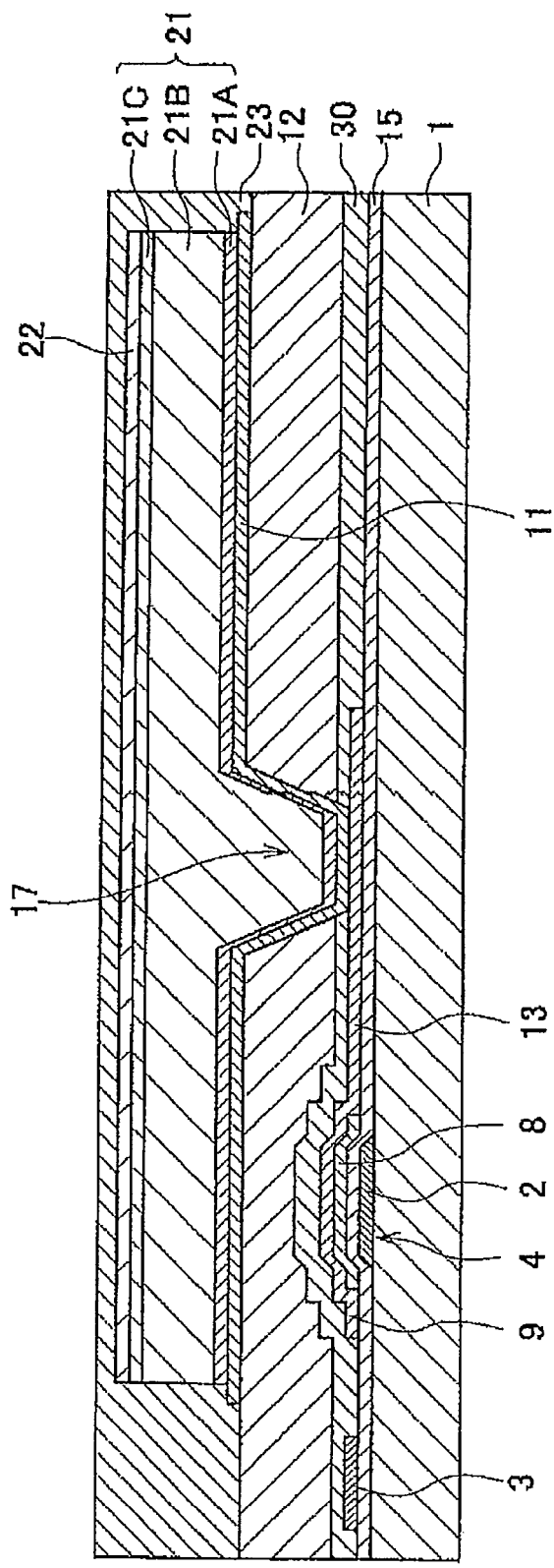
FIG. 5 is a cross-sectional view of a pixel according to an exemplary embodiment.

FIG. 3 is a plan view illustrating a configuration of the radiation detector 10 according to the present exemplary embodiment. FIG. 4 is a cross-sectional view of a pixel 20A, taken on line A-A of FIG. 3. FIG. 5 is a cross-sectional view of a pixel 20B, taken on line B-B of FIG. 3.

As illustrated in FIG. 4, at each pixel 20A of the radiographic detection element 10, the scan line 101 (see FIG. 3) and a gate electrode 2 are formed on the insulating substrate 1, formed of alkali-free glass or the like, and the scan line 101 is connected with the gate electrode 2 (see FIG. 3). A wiring layer in which the scan lines 101 and the gate electrodes 2 (hereinafter referred to as "the first wiring layer") is formed using Al or Cu or a layered film made mainly of Al or Cu. However, the material of the first wiring layer is not limited to these.

An insulating layer 15 is formed over the whole of the first signal layer. Portions of the insulating layer 15 that are disposed above the gate electrodes 2 operates as gate insulation films of the TFT switches 4. The insulating layer 15 is formed of, for example, SiNx or the like, and is formed by, for example, chemical vapor deposition (CVD) film formation.

Semiconductor active layers 8 are formed on the insulating layer 15 as islands over the gate electrodes 2. The semiconductor active layers 8 are channels portions of the TFT switches 4 and include amorphous silicon films, for example.

Source electrodes 9 and drain electrodes 13 are formed in a layer thereabove. The signal lines 3 are also formed in the wiring layer in which the source electrodes 9 and the drain electrodes 13 are formed. The source electrodes 9 are connected to the signal lines 3 (see FIG. 3). The wiring layer in which the source electrodes 9, drain electrodes 13 and signal lines 3 are formed (hereinafter referred to as "the second wiring layer") is formed using Al or Cu or a layered film made mainly of Al or Cu. However, the material of the second wiring layer is not limited to these. An impurity-doped semiconductor layer (not shown in the drawings), formed of impurity-doped amorphous silicon or the like, is formed between the source electrodes 9 and the semiconductor active layers 8 and between the drain electrodes 13 and the semiconductor active layers 8. According to the above, the TFT switches 4 for switching are configured. In the TFT switches 4, the source electrodes 9 and the drain electrodes 13 may be opposite due to the polarities of the charges that are collected and accumulated by lower electrodes 11.

A TFT protection film layer 30 is formed over substantially the whole area of a region in which the pixels 20 are provided on the substrate 1 (almost the whole region), covering the second wiring layer. The TFT protection film layer 30 is for protecting the TFT switches 4 and the signal lines 3. The TFT protection film layer 30 is formed of, for example, SiNx or the like, and is formed by, for example, CVD film formation.

A coated interlayer insulating film 12 is formed on the TFT protective film layer 30. The interlayer insulating film 12 is formed in a film thickness of 1 μm to 4 μm by a photosensitive organic material (e.g., a positive photosensitive acrylic resin: a material in which a naphthoquinone diazide positive photosensitizer is mixed together with a base polymer comprising a copolymer of methacrylic acid and glycidyl methacrylate) having a low permittivity (relative permittivity $\epsilon r$=2 to 4).

In the radiation detector 10 according to the present exemplary embodiment, the capacitance between metals placed on top of and under the interlayer insulating film 12 is kept low by the interlayer insulating film 12. Further, usually this material also has a function as a planarizing film and also may planarize the steps formed below. In the radiation detection element 10 according to the present exemplary embodiment, contact holes 17 are formed in positions in the interlayer insulating film 12 and the TFT protection film layer 30 opposing the drain electrodes 13.

Lower electrodes 11 of the sensor portions 103 are formed on the interlayer insulating film 12 in such a way as to cover the pixel regions while filling in the contact holes 17. The lower electrodes 11 are connected to the drain electrodes 13 of the TFT switches 4. The lower electrodes 11 have virtually no restrictions in their material as long as the material is conductive in a case where later-described semiconductor layers 21 are thick around 1 μm. For this reason, the lower electrodes 11 may be formed using a conductive metal such as an Al material or ITO.

On the other hand, in a case where the film thickness of the semiconductor layers 21 is thin (around 0.2 μm to 0.5 μm), light absorption may not be sufficient in the semiconductor layers 21. For this reason, in order to prevent an increase in leak current resulting from the application of the light to the TFT switches 4, it is preferable for the lower electrodes 11 to be formed using a layered film or an alloy made mainly of a light-blocking metal.

The semiconductor layers 21, which function as photodiodes, are formed on each lower electrodes 11. In the present exemplary embodiment, photodiodes with a PIN structure, in which an n+ layer, an i layer, and a p+ layer (n+ amorphous silicon, amorphous silicon, and p+ amorphous silicon) are layered, are employed as the semiconductor layers 21. The semiconductor layers 21 are formed by sequentially layering an layer 21A, an i layer 21B, and a p+ layer 21C from the lower layer. The i layer 21B generates charges (a free electron and free hole pair) as a result of being light being applied to the i layer 21B. The n+ layer 21A and the p+ layer 21C function as contact layers, and electrically connect the i layer 21B to the lower electrode 11 and a later-described upper electrode 22.

Upper electrodes 22 are individually formed on each of the semiconductor layers 21. A material whose light transmittance is high, such as ITO or IZO (indium zinc oxide), for example, is used for the upper electrodes 22. In the radiation detection element 10 according to the present exemplary embodiment, the sensor portions 103 are configured to include the upper electrodes 22, the semiconductor layers 21, and the lower electrodes 11.

A coated interlayer insulating film 23 is formed on the interlayer insulating film 12, the semiconductor layers 21, and the upper electrodes 22 in such a way as to have openings 27A in portions corresponding to the upper electrodes 22 and in such a way as to cover each of the semiconductor layers 21.

The common electrode lines 25 are formed on the interlayer insulating film 23 by Al or Cu or by an alloy or a layered film made mainly of Al or Cu. Contact pads 27 are formed in the neighborhoods of the openings 27A, and the common electrode lines 25 are electrically connected to the upper electrodes 22 via the openings 27A in the interlayer insulating film 23.

On the other hand, in each radiation detection pixel 20B of the radiographic detector 10, as shown in FIG. 5, the TFT switch 4 is formed such that the source electrode 9 and the drain electrode 13 are in contact. Namely, in the pixel 20B, the source and drain of the TFT switch 4 are short-circuited. Accordingly, charges collected at the lower electrode 11 of the pixels 20B flow into the signal lines 3 regardless of the switching state of the TFT switches 4.

On the radiation detection element 10 that has been formed as described above, a protective film is further formed, if necessary, by an insulating material whose light absorption is low, and a scintillator comprising GOS or the like is adhered on the surface of the protective film using an adhesive resin whose light absorption is low.

Figure 6:
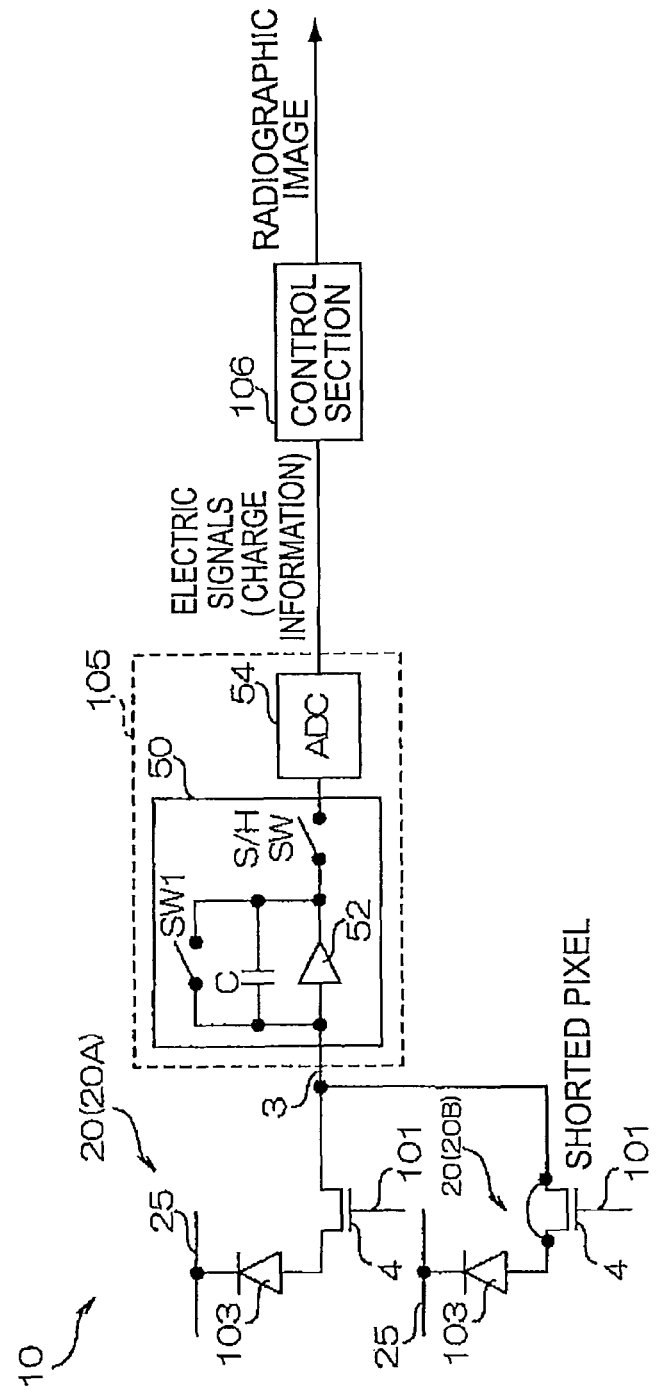
FIG. 6 is a circuit diagram illustrating a configuration of a signal detection circuit according to an exemplary embodiment.

Explanation follows regarding a configuration of the signal detection circuit 105 according to the present exemplary embodiment with reference to FIG. 6.

As shown in FIG. 6, the signal detection circuit 105 of the present exemplary embodiment is configured to include an amplification circuit 50 and an ADC 54. Although not illustrated in FIG. 6, the amplification circuit 50 is provided for each signal line 3. Namely, the signal detection circuit 105 is configured to include the same number of plural amplifier circuits 50 as the number of signal lines 3 in the radiation detector 10.

The amplification circuit 50 is constituted by a charge amplification circuit. The amplification circuit 50 is provided with an amp 52 such as an operational amp or the like, a capacitor C connected in parallel with the amp 52, and a charge reset switch SW1 connected in parallel with the amp 52.

In the amplification circuit 50, when the charge reset switch SW1 is in the OFF state, charges (electric signals) are read out by the TFT switches 4 of the pixels 20. Then, the charges read out by the TFT switches 4 are accumulated at the capacitor C, and a voltage value outputted from the amp 52 in accordance with the accumulated charge amount is amplified.

The control section 106 applies a charge reset signals to the charge reset switch SW1 and performs control to switch the charge reset switch SW1 ON and OFF. Note that in a case in which the charge reset switch SW1 is switched ON, the input side and output side of the amp 52 are short-circuited, and charges at the capacitor C are discharged.

The ADC 54 converts electric signals that are analog signals inputted from the amplification circuit 50 to digital signals, in a state in which a sample-hold (S/H) switch SW is switched ON. The ADC 54 serially outputs the electric signals converted to digital signals to the control section 106.

The electric signals outputted from all the amplification circuits 50 provided in the signal detection circuit 105 are inputted to the ADC 54 of the present exemplary embodiment. Namely, the signal detection circuit 105 of the present exemplary embodiment is provided with a single ADC 54 regardless of the number of amplification circuits 50 (and signal lines 3).

In the radiographic imaging device 100 according to the present exemplary embodiment, electric signals from at least one of the signal lines 3 connected to the pixels 20B (at least one of the signal lines 3 labeled D2 and/or D6 in FIG. 2) are amplified in the amplification circuit 50 of the signal detection circuit 105. The control section 106 compares the value of the digital signal converted by the ADC of the signal detection circuit 105 with a predetermined radiation detection threshold value, to detect whether radiation has been irradiated, depending on whether the digital signal value is the threshold value or greater. Therefore, in the present exemplary embodiment, control signals from the control device 202 are not required for detection of the irradiation of the radiation, and therefore, the radiographic imaging device 100 according to the present exemplary embodiment is configured to be "synchrony-free". The determination by the control section 106 of whether or not radiation has been irradiated, is not limited to this comparison with a radiation detection threshold value. For example, the control section 106 may detect the irradiation of radiation on the basis of a pre-specified condition, such as a number of detections or the like.

In the radiation detector 10 of the present exemplary embodiment, the signal lines 3 that are connected to both the radiation imaging pixels 20A and the radiation irradiation state detection pixels 20B (referred to below as "specific signal lines 3"), and signal lines 3 that are only connected to the pixels 20A (referred to below as "normal signal lines 3"), are both present. Note that, in the radiation detector 10 according to the present exemplary embodiment, the same number of the pixels 20B is connected to each of the specific signal lines 3.

Among the signal lines 3 the line capacitance between the specific signal lines 3 and the normal signal lines 3 is different, due to the capacitance component of the pixels 20 that are connected thereto. As a result, line shaped image irregularities (artifacts) tend to occur in the radiographic images obtained by imaging.

However in the radiographic imaging device 100 according to the present exemplary embodiment, as shown in FIG. 2, a capacitor 5, having a capacitance equal to or lower than the difference between the line capacitance of the specific signal lines 3 and the line capacitance of the normal signal lines 3, is connected to each of the normal signal lines 3.

Note that, in the radiographic imaging device 100 according to the present exemplary embodiment, the capacitor 5 is connected to the signal lines 3 that have a difference equal to or greater than a predetermined value, in which the difference is a difference when maximum line capacitance out of the plurality of signal lines is compared to its line capacitance (in the present exemplary embodiment, predetermined value may be ⅓ of the maximum line capacitance).

For example, a case in which the line capacitance of each of the signal lines 3 themselves is 200 pF, the resistance value of each of the signal lines 3 is 10 kΩ, the capacitance of each of the pixels 20 is 1 pF, and there are 100 pixels 20B connected to a single specific signal line 3, the line capacitance of the normal signal lines 3 becomes 200 pF, and the time constant becomes 2μ seconds, however, the line capacitance of the specific signal lines 3 becomes 300 pF, and the time constant becomes 3μ seconds.

In the above case, hereinafter, a case in which one capacitor 5 of 50 pF, which is a capacitance less than the difference between the line capacitance of the specific signal lines 3 and the normal signal lines 3 (100 pF in this case), is connected to each of the normal signal lines 3 will be described. In such case, the line capacitance of the normal signal lines 3 becomes 250 pF and the time constant becomes 2.5μ seconds, however the line capacitance of the specific signal lines 3 remains at 300 pF and the time constant remains at 3μ seconds. Accordingly, the difference between the time constants of the specific signal lines 3 and the normal signal lines 3 may be made smaller, and the signal delay period between the specific signal lines 3 and the normal signal lines 3 may be reduced. Accordingly, the generation of line shaped image irregularities may be suppressed.

Note that, in the above case, the capacitors 5 may be formed within the stacked layer that configures the radiation detector 10, formed by the same fabrication processes for forming the sensor portions 103 and the TFT switches 4. Alternatively, the capacitors 5 may be attached to the radiation detector 10 after forming the radiation detector 10.

As described in detail above, according to the radiation detector 10 of the present exemplary embodiment, the line capacitance difference between the plural signal lines are adjusted so as to be reduced, by an adjusting element (the capacitor 5 of the present exemplary embodiment) being connected to at least one of the plural signal lines (to the normal signal lines 3 in the present exemplary embodiment). Consequently, in the radiation detector 10 of the present exemplary embodiment, image irregularities in imaged radiographic images may be suppressed.

According to the radiation detector 10 of the present exemplary embodiment, the adjusting elements are connected to the signal lines having line capacitance giving a predetermined value difference or greater to the maximum line capacitance in the plural signal lines. Consequently, in the radiation detector 10 according to the present exemplary embodiment, a desired image irregularity suppressing effect can be obtained according to the value set as the preset value.

In the radiation detector 10 of the present exemplary embodiment, the adjusting elements that have a capacitance equal to or less than the difference are used. Consequently, in the radiation detector 10 according to the present exemplary embodiment, image irregularities may be reliably suppressed from occurring.

According to the radiation detector 10 of the present exemplary embodiment, capacitive elements are applied for the adjusting elements. Consequently, the adjusting elements can be formed by fabrication processes similar to those of the image detection pixels (the pixels 20A in the present exemplary embodiment) and the radiation detection pixels (the pixels 20B in the present exemplary embodiment). Accordingly, the radiation detector 10 according to the present exemplary embodiment may be fabricated more easily.

According to the radiation detector 10 of the present exemplary embodiment, the image detection pixels include sensor portions (the sensor portions 103 in the present exemplary embodiment) for accumulating charges generated due to irradiation of radiation, and switching elements (the TFT switches 4 in the present exemplary embodiment) for reading the charges that have been accumulated in the sensor portions. The radiation detection pixels include the sensor portions, and switching elements in which the switching terminals are short-circuited. Accordingly, the radiation detector 10 of the present exemplary embodiment can be configured with the image detection pixels and the radiation detection pixels having substantially the same configuration as each other.

Accordingly, the radiation detector 10 of the present exemplary embodiment may be fabricated more easily than in cases in which the image detection pixels and the radiation detection pixels are of different configurations to each other.

According to the present exemplary embodiment, since the radiographic imaging device 100 is equipped with the radiation detector 10 configured as described above, image irregularities in the imaged radiographic images may be suppressed from occurring, similarly to with the radiation detector 10.

In particular, the radiographic imaging device 100 of the present exemplary embodiment may detect the start of irradiation of radiation, by employing the start of irradiation of radiation as the radiation irradiation state for detection.

According to the radiographic imaging system 200 of the present exemplary embodiment, due to including the radiographic imaging device 100 as described above, image irregularities in the imaged radiographic images may be suppressed from occurring, similarly to with the radiographic imaging device 100.

Figure 7:
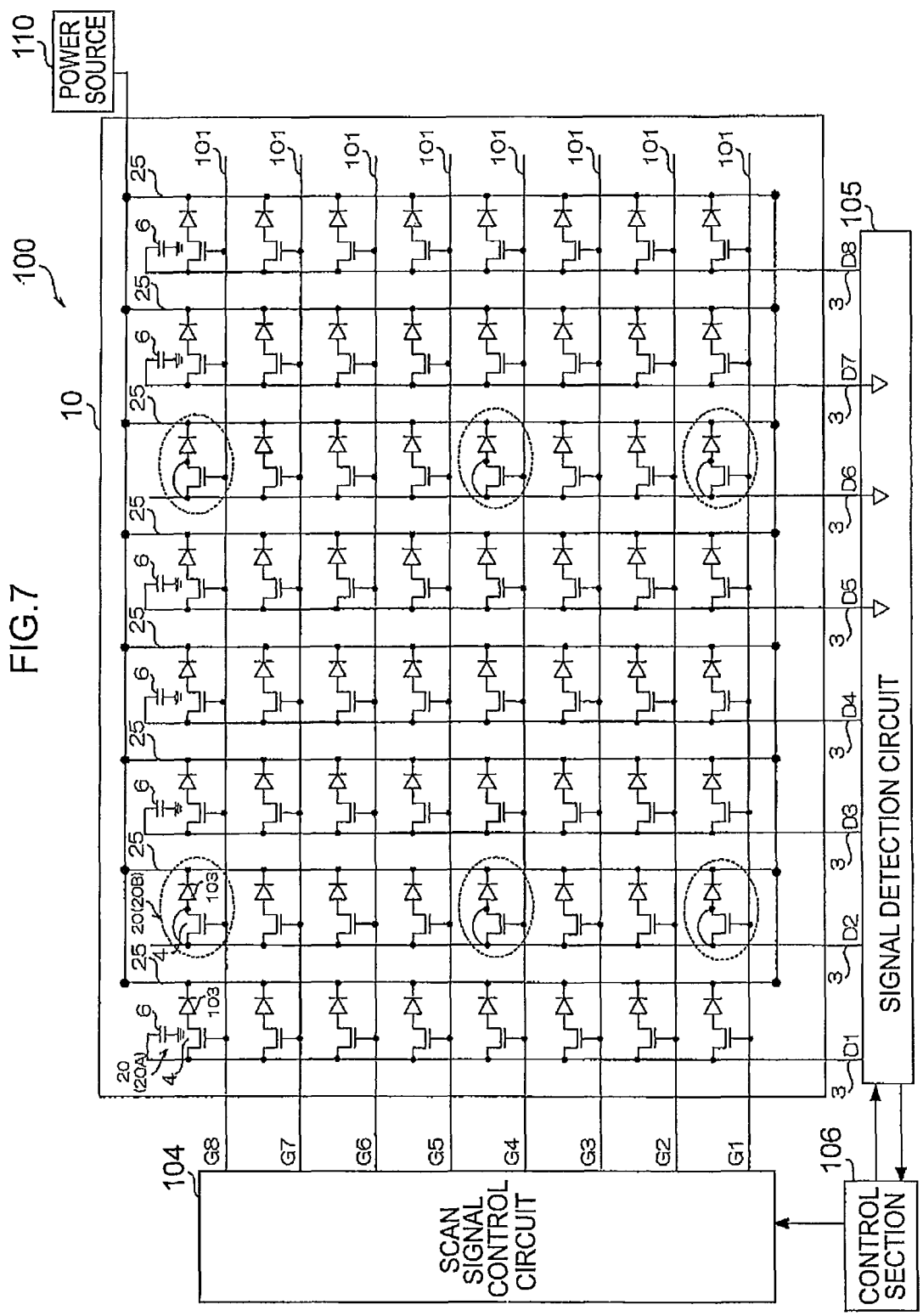
FIG. 7 is a circuit diagram (and partial block diagram) illustrating relevant portions of an electric system of a modified example of a radiographic imaging device according to the first exemplary embodiment.
Figure 8:
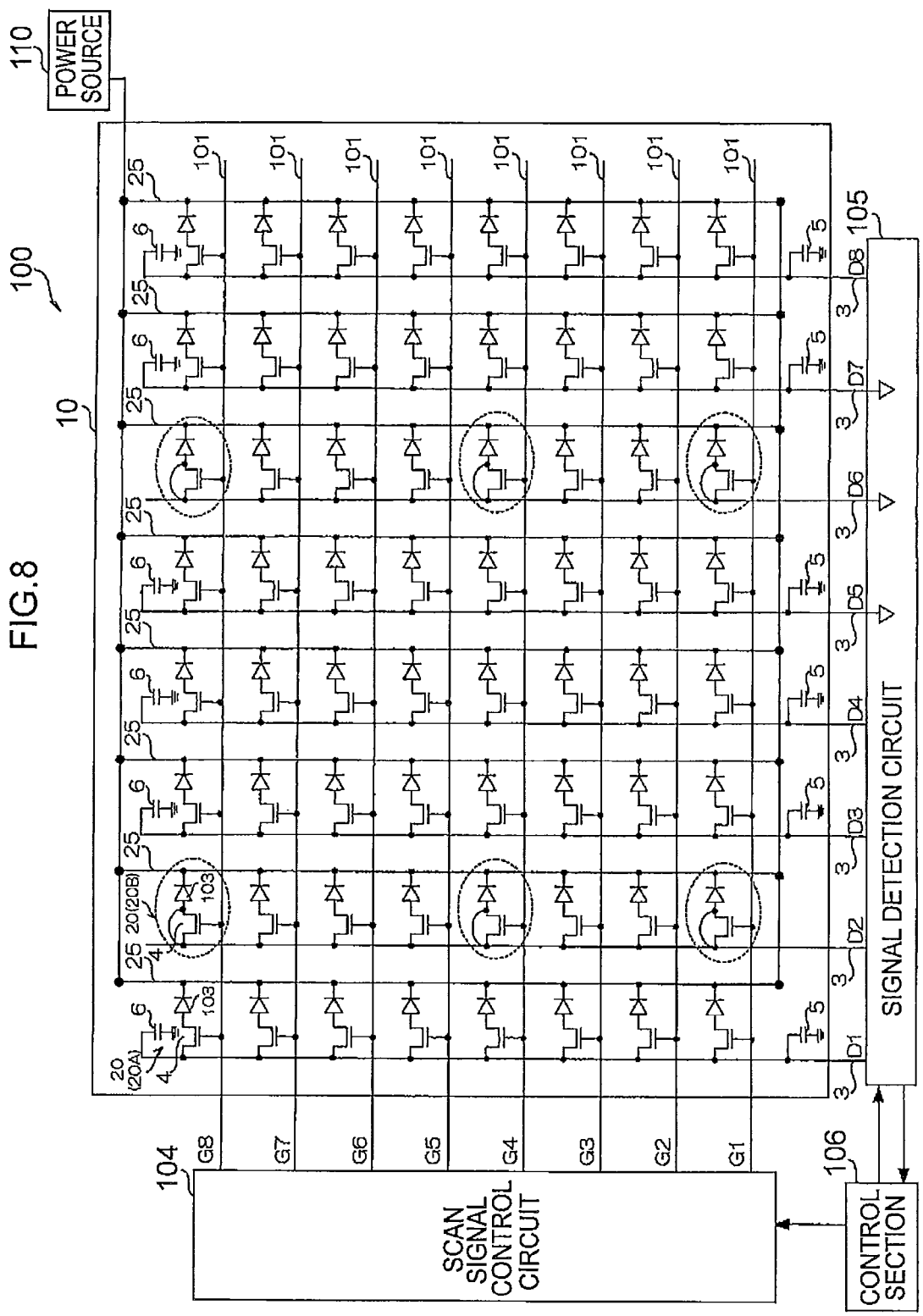
FIG. 8 is a circuit diagram (and partial block diagram) illustrating relevant portions of an electric system of a modified example of a radiographic imaging device according to the first exemplary embodiment.

In the present exemplary embodiment, a case in which adjusting elements (capacitors 5) are connected to a one end portion side (the side of the end portion on the signal detection circuit 105 side) outside of the region where the pixels 20 are connected on the signal lines 3, has been described. However, the present invention is not limited thereto. For example, as shown in FIG. 7, the adjusting elements (capacitors 6 in FIG. 7) may be connected to other end portion side, outside the region in which the pixels 20 are connected on the signal lines 3. Further, for example, as shown in FIG. 8, the adjusting elements (capacitors 5 and capacitors 6 in FIG. 8) may be connected to both end portion sides of the signal lines 3.

Figure 9:
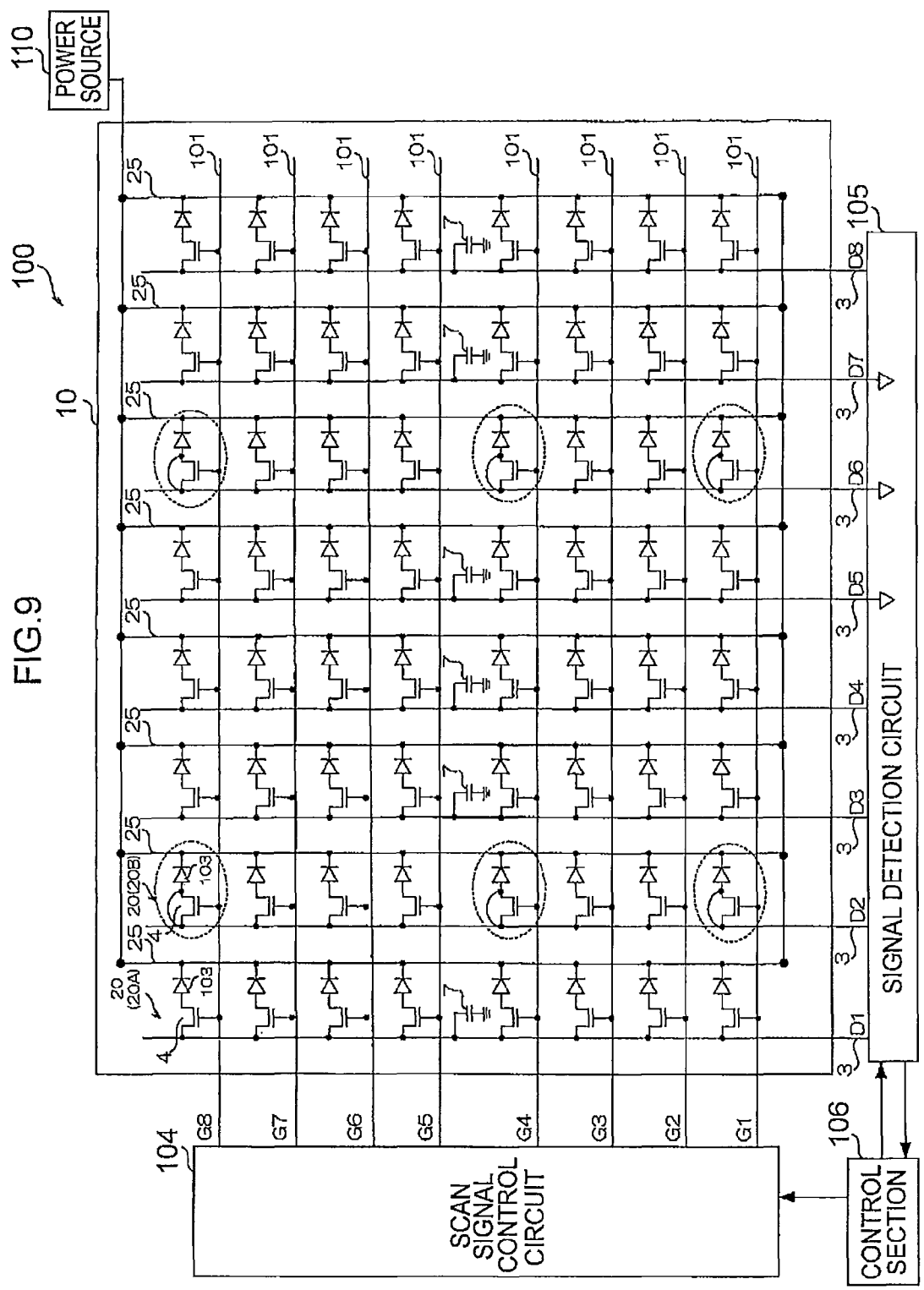
FIG. 9 is a circuit diagram (and partial block diagram) illustrating relevant portions of an electric system of a modified example of a radiographic imaging device according to the first exemplary embodiment.
Figure 10:
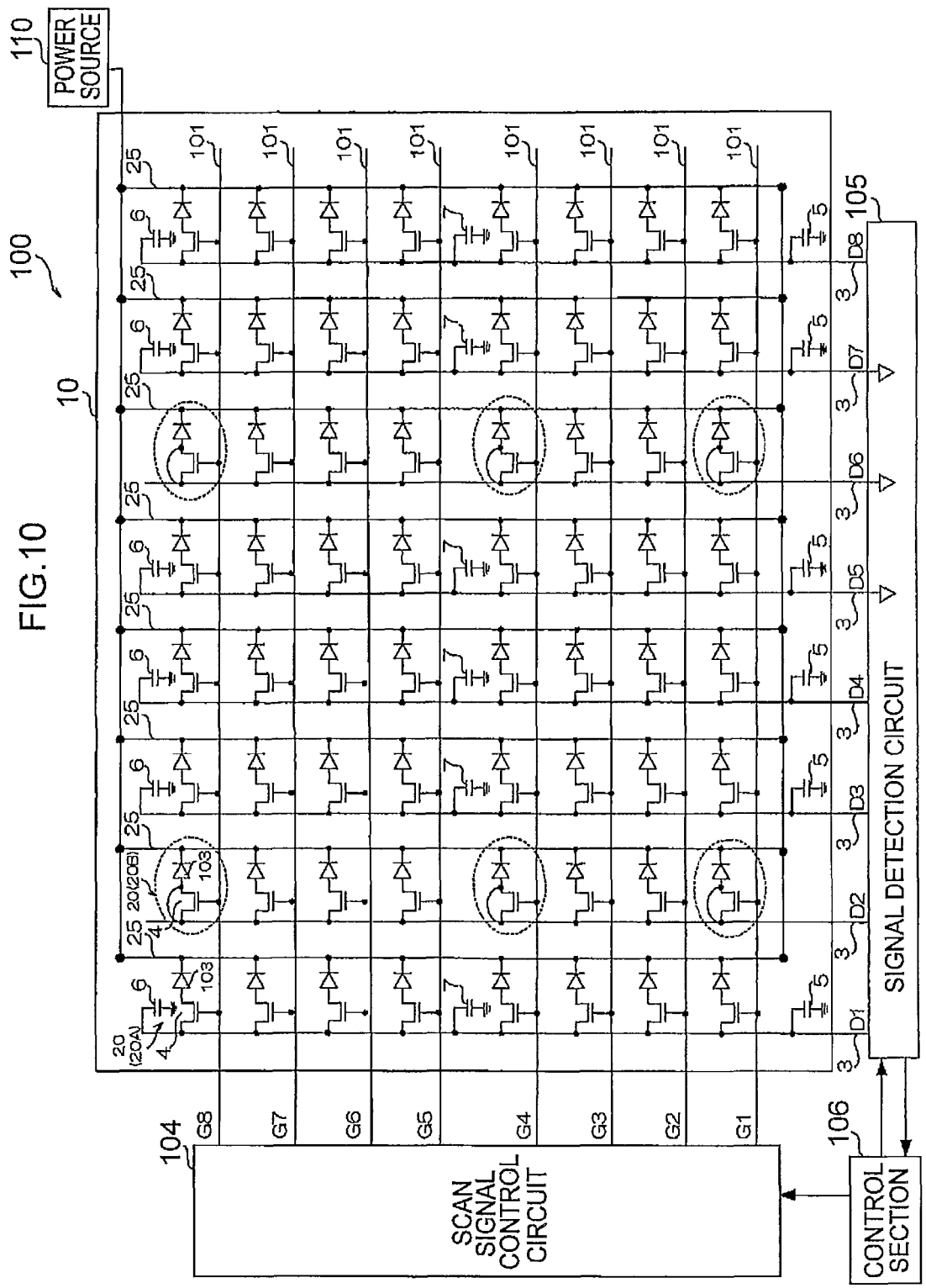
FIG. 10 is a circuit diagram (and partial block diagram) illustrating relevant portions of an electric system of a modified example of a radiographic imaging device according to the first exemplary embodiment.

Further, for example, as shown in FIG. 9, the adjusting elements (capacitors 7 in FIG. 9) may be connected inside the region where the pixels 20 are connected on the signal lines 3 (referred to as "internally"). Furthermore, for example, as shown in FIG. 10, the adjusting elements (capacitors 5, capacitors 6 and capacitors 7 in FIG. 10) may be connected at all these locations, at the one end portion side, the other end portion side and internally. Furthermore, while not shown in the drawings, the adjusting elements may be connected at the two locations of the one end portion side and internally, or connected at the two locations at the other end portion side and internally.

Figure 11:
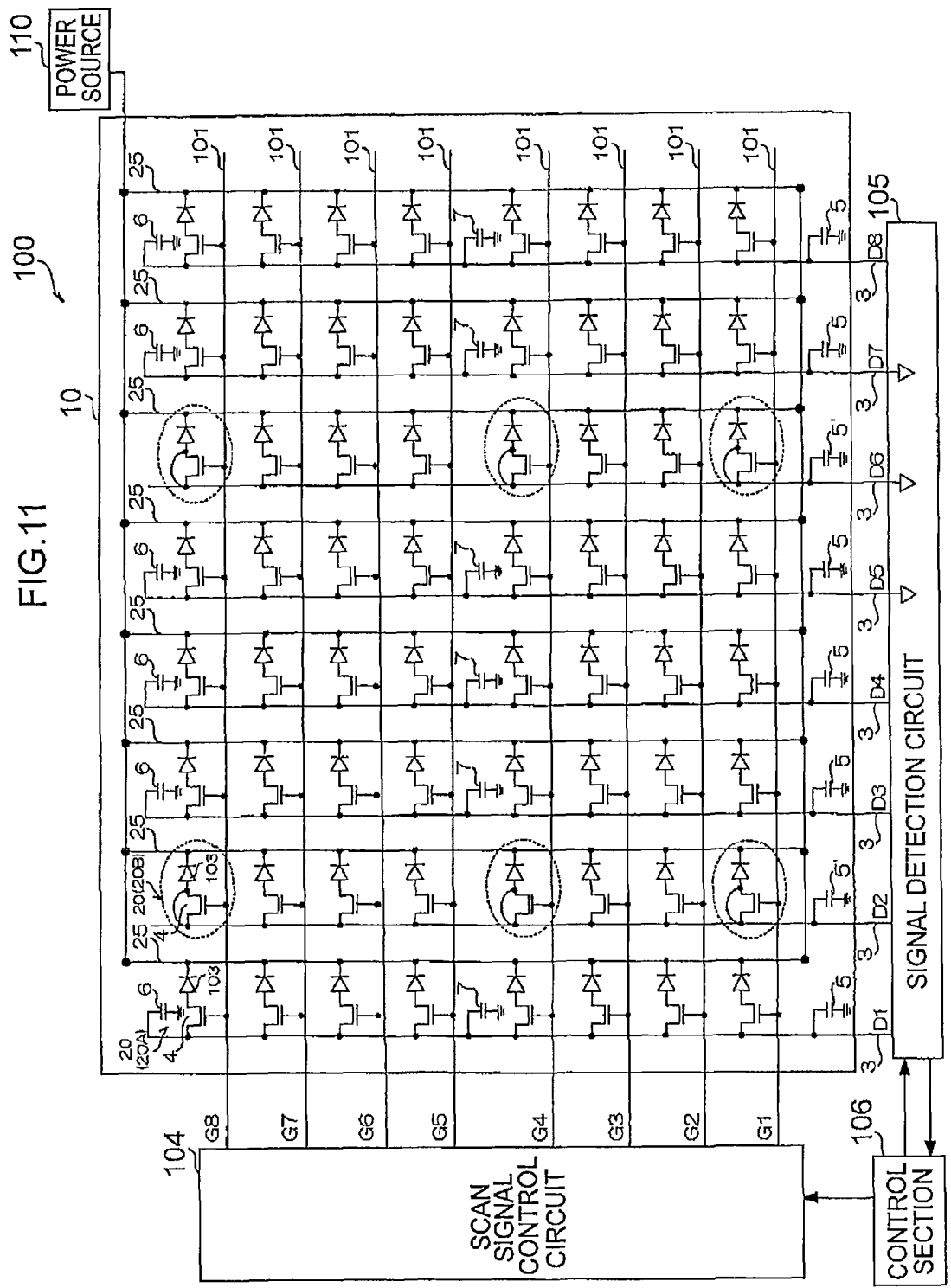
FIG. 11 is a circuit diagram (and partial block diagram) illustrating relevant portions of an electric system of a modified example of a radiographic imaging device according to the first exemplary embodiment.

In the above exemplary embodiment, a cases in which the adjusting elements are only connected to the normal signal lines 3, has been described. However the present invention is not limited thereto. For example, as shown in FIG. 11, in addition to connection to the normal signal lines 3, adjusting elements (capacitors 5' in FIG. 11) may be also connected to the specific signal lines 3. In such case, similarly to when connecting to the normal signal lines 3, the adjusting elements may be connected to any single location from the second end portion side or internally, or connected to each location in a combination of plural locations selected from the first end portion side, the second end portion side and internally. In such case, the difference in line capacitance may be reduced with greater precision.

In such case, the number of the pixels 20B connected to each of the specific signal lines 3 does not need to be made the same, and more precise line capacitance matching may be achieved for each of the signal lines 3, by separately setting the individual capacities of the adjusting elements.

Figure 12:
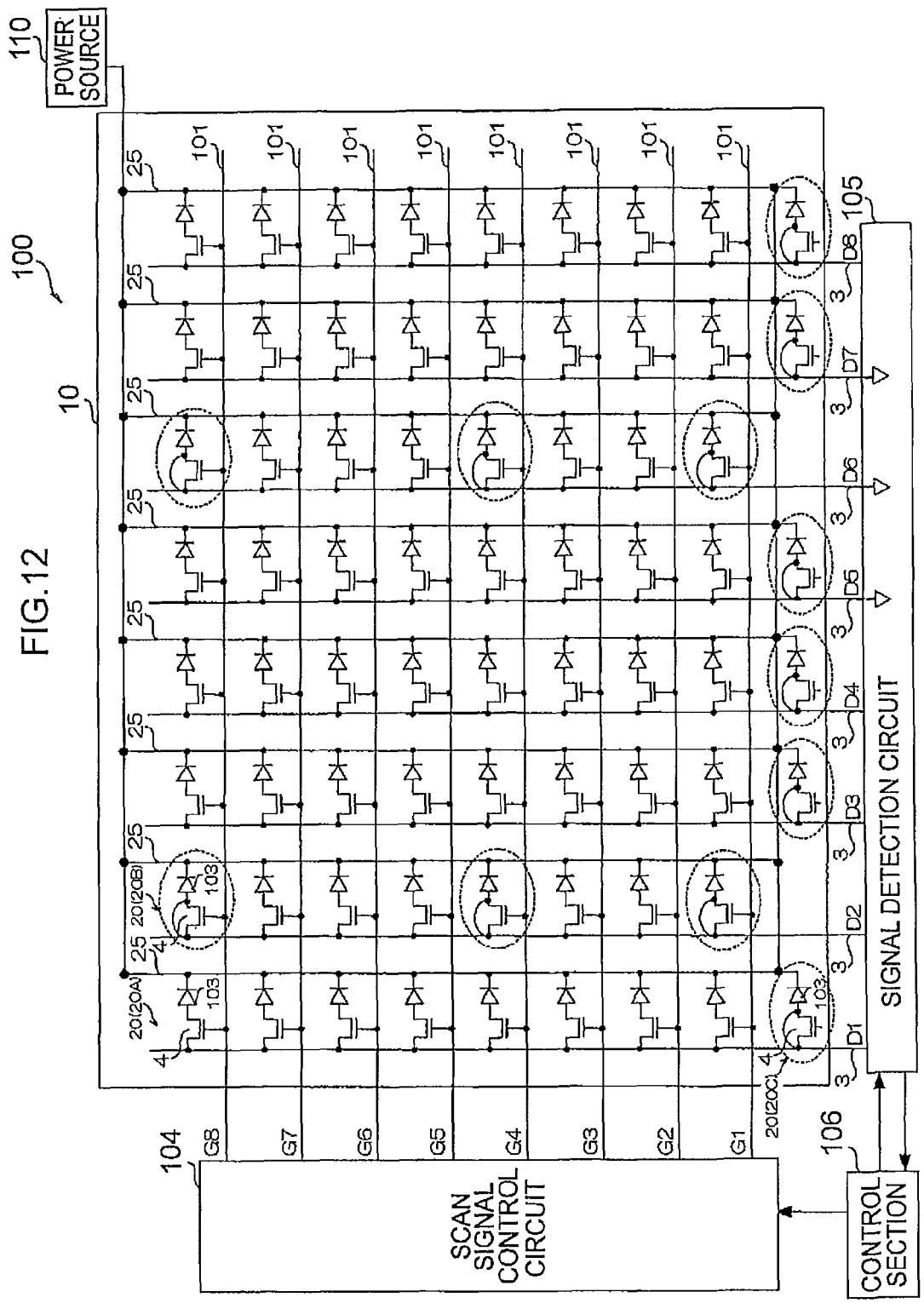
FIG. 12 is a circuit diagram (and partial block diagram) illustrating relevant portions of an electric system of a modified example of a radiographic imaging device according to the first exemplary embodiment.

In the above exemplary embodiment, a case in which capacitors are employed as the adjusting elements of the present invention, has been described. However the present invention is not limited thereto. For example, as shown in FIG. 12, pixels 20C having similar configuration to the pixels 20B may be employed as the adjusting elements. Note that, in such case, similarly to when capacitors are employed as the adjusting elements, the pixels 20C may be connected at a single location from the first end portion side, the second end portion side or internally, or the pixels 20C may be connected to each location in a combination of plural locations selected from the first end portion side, the second end portion side and internally. In such case, even simpler fabrication can be achieved in comparison to cases in which the adjusting elements are configured differently from the pixels 20B.

[Second Exemplary Embodiment]

In the first exemplary embodiment, a case in which the adjusting elements are provided to the radiation detector 10, has been described. However, in a second exemplary embodiment explanation, a case in which the adjusting elements are not provided to the radiation detector 10, and instead, the adjusting elements are provided to other portions of the radiographic imaging device 100, will be described.

Figure 13:
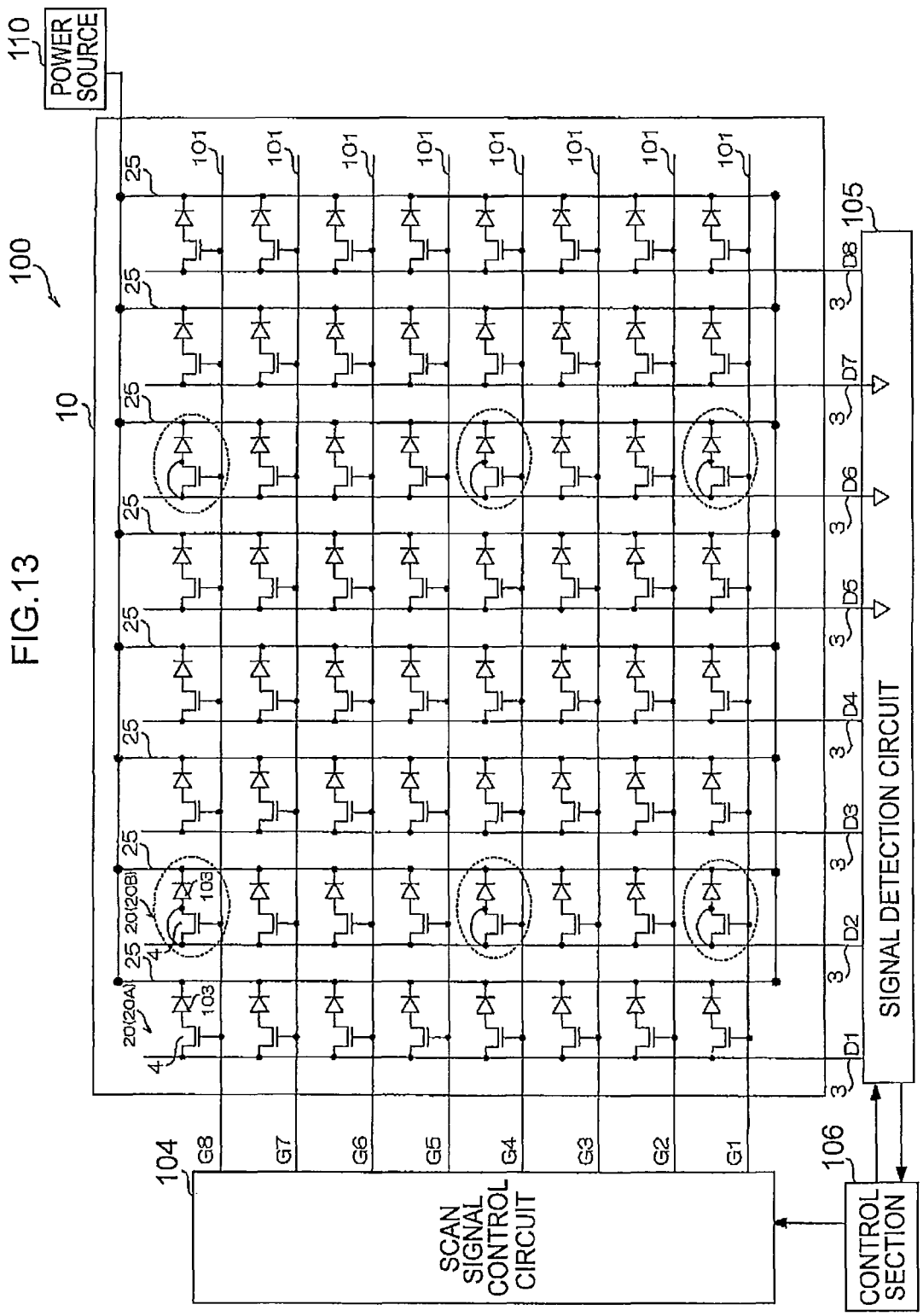
FIG. 13 is a circuit diagram (and partial block diagram) illustrating relevant portions of an electric system of a radiographic imaging device according to a second exemplary embodiment.

Explanation follows, with reference to FIG. 13, regarding an electric configuration of the radiographic imaging device 100 of the second exemplary embodiment. Configurations in FIG. 13 similar to those of FIG. 2 are allocated the same reference numerals as in FIG. 2, and explanation thereof is omitted.

As shown in FIG. 13, the radiographic imaging device 100 according to the present exemplary embodiment only differs from the radiographic imaging device 100 of the first exemplary embodiment in that the capacitors 5 are not provided to the radiation detector 10.

Figure 14:
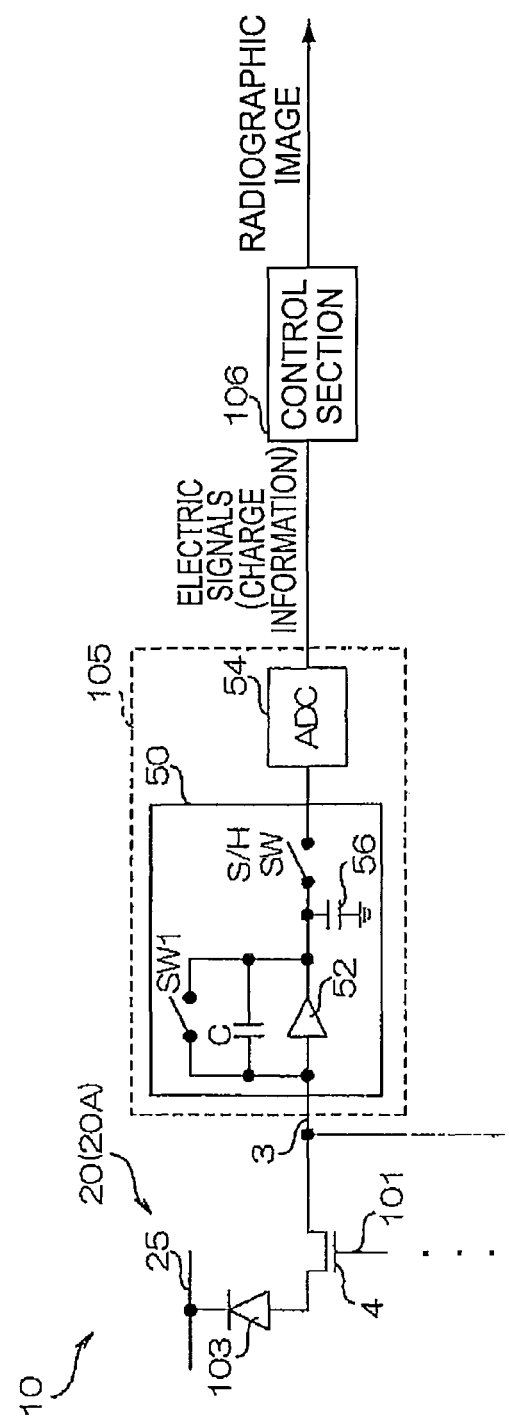
FIG. 14 is a circuit diagram illustrating a configuration of a signal detection circuit according to the second exemplary embodiment.

Explanation follows regarding a configuration of signal detection circuit 105 according to the second exemplary embodiment with reference to FIG. 14. Configurations in FIG. 14 similar to those of FIG. 6 are allocated the same reference numerals as in FIG. 6, and explanation thereof is omitted.

As shown in FIG. 14, the signal detection circuit 105 of the present exemplary embodiment differs from the first exemplary embodiment, only in the point that a capacitor 56 is connected in parallel between an amplifier 52 of an amplification circuit 50 and an S/H switch SW. The capacitors 56 function as the adjusting elements of the present invention, and similarly to in the first exemplary embodiment, the capacitors 56 have a capacitance or less than the line capacitance difference between the specific signal lines 3 and the normal signal lines 3.

In the radiographic imaging device 100 of the present exemplary embodiment, the adjusting elements (the capacitors 56) are only connected to the amplification circuits 50 that are connected to the normal signal lines 3. However the present invention is not limited thereto. The adjusting elements may be connected to the amplification circuits 50 connected to the specific signal lines 3, as well as to the amplification circuits 50 connected to the normal signal lines 3.

In the radiographic imaging device 100 of the present exemplary embodiment, the adjusting elements are provided within the amplification circuits 50. However the present invention is not limited thereto. The adjusting elements may be provided at any portion at connection lines that connects the signal lines 3 and the ADCs 54.

According to the second exemplary embodiment, substantially similar effects may be obtained as in the first exemplary embodiment. Further, in the second exemplary embodiment, a conventional configuration may be used as the radiation detector 10.

The present invention has been described by the above exemplary embodiments, however, the scope of the present invention is not limited by the above described exemplary embodiments. Note that various modifications and improvements may be made to the above exemplary embodiments within a scope not departing from the spirit of the invention, and such modifications and improvements are included within the scope of the present invention.

Further, the above exemplary embodiments do not limit the invention according to the claims, and not all of the features that have been combined in the above explained exemplary embodiments are essential to the solution of the invention. The exemplary embodiments contain various stages of the invention, and various aspects of the invention can be extracted by appropriately combining the plural configurations described above. As long as the effect is obtained, a number of configurations may be omitted from the overall configuration described in the exemplary embodiments, to obtain an aspect of the invention.

For example, in each of the above exemplary embodiments, a case in which an indirect conversion method is employed for the radiation detector, have been described. However, the present invention is not limited thereto. For example, a direct-conversion-type radiation detector that directly converts irradiated radiation into charges by a semiconductor layer formed of such as, amorphous selenium (a-Se), may be applied to the present invention.

Furthermore, in each of the above exemplary embodiments, a case in which the start of irradiation of the radiation is detected as the target radiation irradiation state for detection by the pixels 20B, have been described. However, the present invention is not limited thereto. For example, a combination of one or more states for detection may be applied out of the radiation irradiation start, radiation irradiation amount, or a radiation irradiation end. In such cases, similar advantageous effects may also be exhibited to those of the above exemplary embodiments.

In the above exemplary embodiments, cases in which the pixels 20B are, similarly to the pixels 20A, provided with the sensor portions 103 and the TFT switches 4, has been described. However, the present invention is not limited thereto. The pixels 20B may be configured with a different configuration from those of the pixels 20A.

Figure 15:
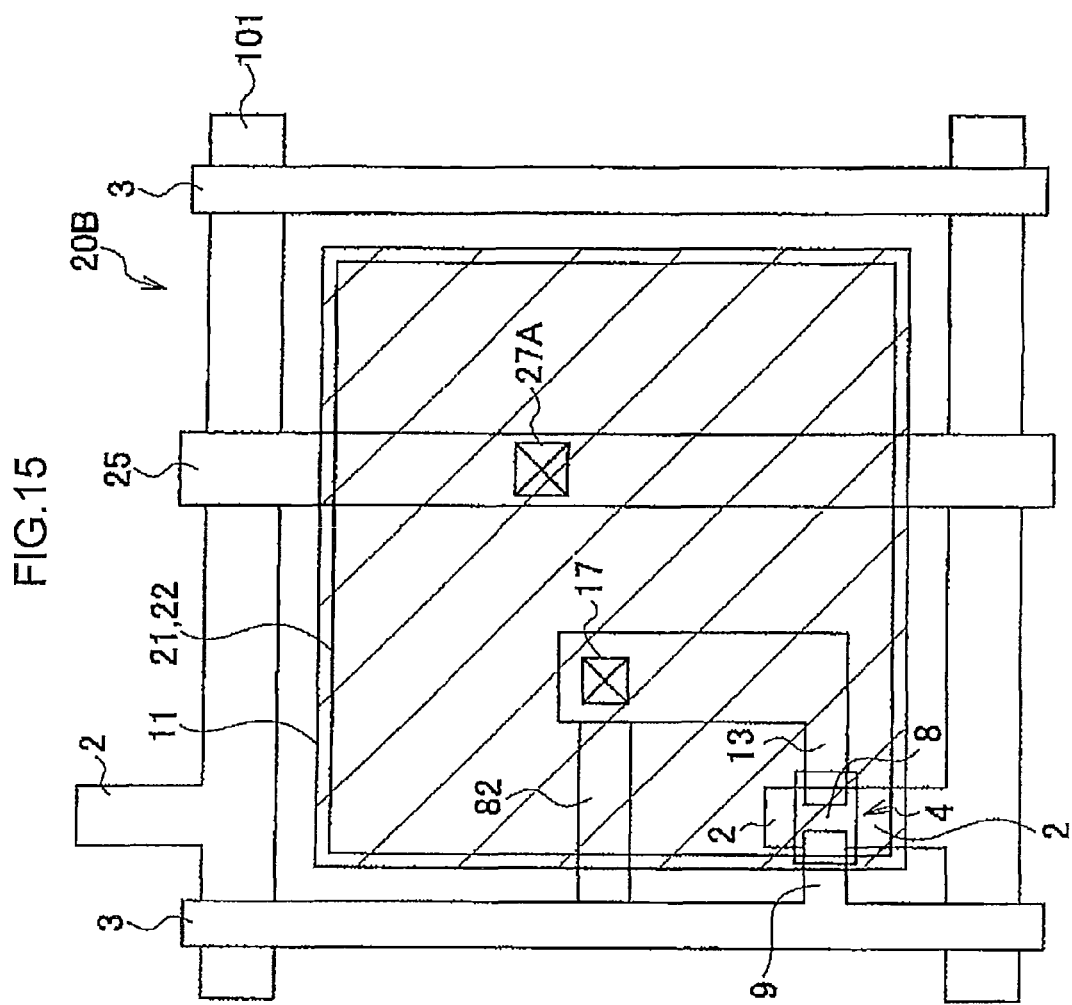
FIG. 15 is a plan view illustrating a configuration of a pixel according to an alternative exemplary embodiment.
Figure 16:
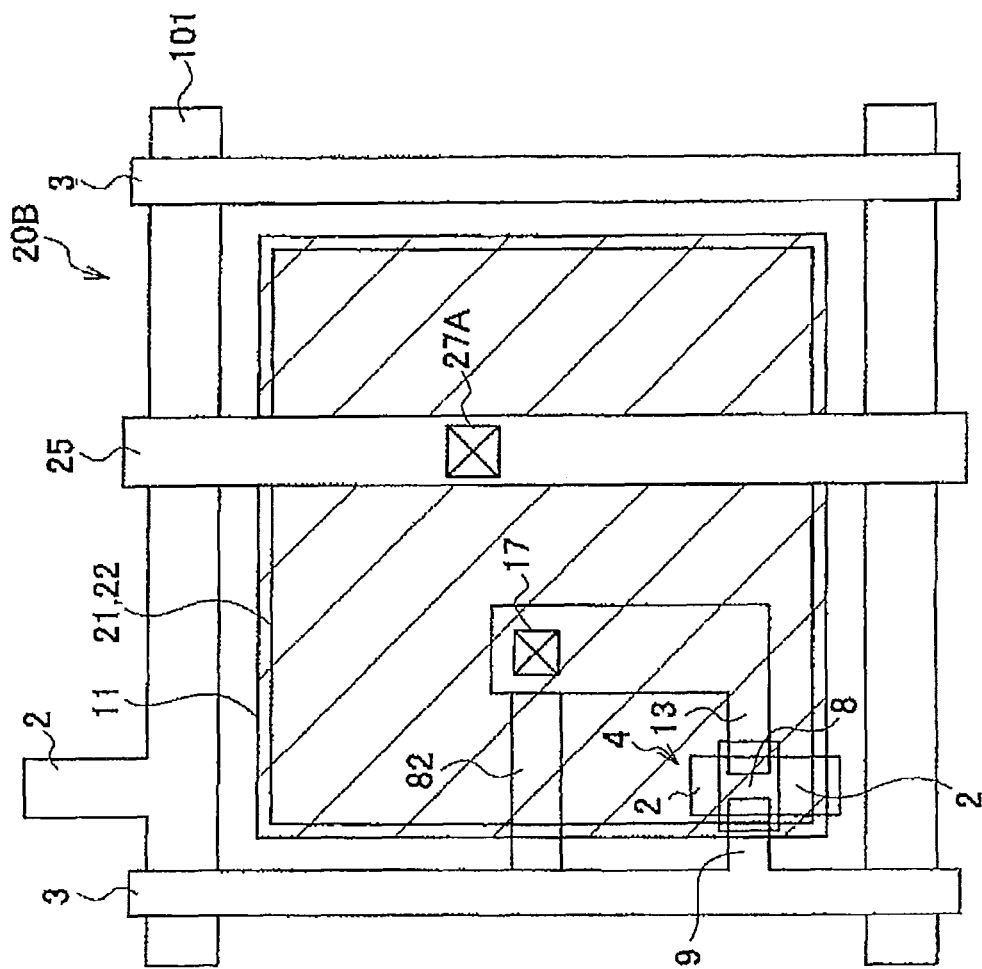
FIG. 16 is a plan view illustrating a configuration of a pixel according to an alternative exemplary embodiment.

In the above exemplary embodiments, cases in which pixels 20B including the TFT switches 4 with sources and drains short-circuited has been described. However, the present invention is not limited thereto. For example, as shown in FIG. 15, a connection line 82 may be formed from the drain electrode 13 so as to connect the signal line 3. In such case, also, the source and the drain of each of the TFT switches 4 are short-circuited. In a case in which the source and drain of each of the TFT switches 4 are short-circuited, as in the above exemplary embodiments and as in FIG. 15, gate electrodes 2 may be formed so as to be separated from scan lines 101, as shown in FIG. 16.

Furthermore, as shown in FIG. 17, in each pixel 20B, a connection line 82 may be formed, a sensor portion 103 and a signal line 3 may connected via the connection line 82 and a contact hole 17, and the drain electrode 13 and the contact hole 17 may be electrically isolated from each other.

Note that the configurations of the radiographic imaging system, the radiographic imaging device, the radiation detector, and the signal detection circuit described in the above exemplary embodiments are merely examples. Accordingly, portions not required may be omitted, new portions may be added, and may be suitably modified within a scope not departing from the spirit of the present invention.

What is claimed is:

1. A radiation detector comprising:
    a plurality of radiation detection pixels that are configured to detect a state of irradiation of radiation;
    a plurality of image detection pixels that are configured to detect a radiographic image expressing the radiation that has passed through an imaging subject;
    a plurality of signal lines, each of a first set of the plurality of signal lines is connected to some of the plurality of image detection pixels and each of a second set of the plurality of signal lines is connected to some of the plurality of image detection pixels and at least one of the radiation detection pixels; and
    at least one adjusting element, each connected to one of the plurality of signal lines, that is configured to adjust capacitance to reduce the line capacitance difference between at least two of the plurality of signal lines.

2. The radiation detector of claim 1 wherein, said line capacitance difference is equal to or greater than a predetermined value, wherein the line capacitance difference is a difference between a maximum line capacitance of the plurality of signal lines and a capacitance of said one of the plurality of signal lines.

3. The radiation detector of claim 2 wherein the at least one adjusting element has a capacitance less than the line capacitance difference.

4. The radiation detector of claim 1 wherein each of the plurality of signal lines is connected to at least one of the at least one adjusting element.

5. The radiation detector of claim 1 wherein the at least one adjusting element is a capacitive element.

6. The radiation detector of claim 1 wherein
    the image detection pixels each comprises a sensor portion that is configured to accumulate charges that are generated due to irradiation of the radiation, and a switching element that is configured to read out the charges that have been accumulated in the sensor portion, and
    the radiation detection pixels each comprises the sensor portion, and the switching element having switch terminals short-circuited.

7. The radiation detector of claim 6 wherein the at least one adjusting element is configured similarly to the radiation detection pixels.

8. The radiation detector of claim 1 wherein
    the at least one adjusting element is connected in at least one position selected out of,
    one end portion side of the signal line outside a region where the at least one of the radiation detection pixels and/or the image detection pixels are connected,
    an end that is other than said one end portion side of the signal line and is outside the region; and
    inside a connection region of the signal line in which plural radiation detection pixels and/or plural image detection pixels are connected.

9. A radiographic imaging device comprising:
    the radiation detector of claim 1; and
    a determination section that is configured to determine the state of irradiation of radiation based on electric signals obtained from the second set of the plurality of signal lines.

10. The radiographic imaging device of claim 9 wherein the radiation irradiation state is at least one state out of start of irradiation of the radiation, irradiance level of the radiation, or end of the irradiation of the radiation.

11. A radiographic imaging system comprising:
the radiographic imaging device of claim 9; and
a radiation irradiation device that is configured to irradiate the radiation for imaging the radiographic image in the radiographic imaging device.

12. A radiographic imaging device comprising:
a radiation detector comprising,
- a plurality of radiation detection pixels that are configured to detect a state of irradiation of radiation,
- a plurality of image detection pixels that are configured to detect a radiographic image expressing the radiation that has passed through an imaging subject, and
- a plurality of signal lines, each of a first set of the plurality of signal lines is connected to some of the plurality of image detection pixels and each of a second set of the plurality of signal lines is connected to some of the plurality of image detection pixels and at least one of the radiation detection pixels;

a determination section that is configured to determine the state of irradiation of radiation based on electric signals obtained from the second set of the plurality of signal lines; and at least one adjusting element, each connected to one of the plurality of signal lines, that is configured to adjust capacitance to reduce the line capacitance difference between at least two of the plurality of signal lines.

13. The radiographic imaging device of claim 12 further comprising:
a plurality of amplification circuits that are configured to amplify the electric signals flowing in the plurality of signal lines, wherein the at least one adjusting element is connected to the plurality of amplification circuits.

14. A line capacitance adjusting method for a radiation detector, wherein the radiation detector includes a plurality of radiation detection pixels, a plurality of image detection pixels, a plurality of signal lines where each of a first set of the plurality of signal lines is connected to some of the plurality of image detection pixels and each of a second set of the plurality of signal lines is connected to some of the plurality of image detection pixels and at least one of the radiation detection pixels and at least one adjusting element each connected to one of the plurality of signal lines, the line capacitance adjusting method comprising:
- detecting a state of irradiation of radiation with the plurality of radiation detection pixels;
- detecting a radiographic image expressing the radiation that has passed through an imaging subject with the plurality of image detection pixels; and
- adjusting capacitance to reduce the line capacitance difference between at least two of the plurality of signal lines with the at least one adjusting element.

\* \* \* \* \*